(12) United States Patent
Nave (10) Patent No.: US 7,443,455 B2
(45) Date of Patent: Oct. 28, 2008

(54) AUTOMATIC GAIN CONTROL BASED ON MULTIPLE INPUT REFERENCES IN A VIDEO DECODER

(75) Inventor: James E. Nave, Denton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 712 days.

(21) Appl. No.: 10/748,966

(22) Filed: Dec. 30, 2003

(65) Prior Publication Data

US 2005/0162562 A1    Jul. 28, 2005

(51) Int. Cl.
*H04N 5/52* (2006.01)
(52) U.S. Cl. .................. 348/678; 348/685; 348/528; 348/255; 348/679; 348/194
(58) Field of Classification Search ................ 348/678, 348/685, 528, 255, 682, 679, 697, 694, 572, 348/229.1, 180, 194; 375/345; 330/278; 386/9, 93; 455/250.1, 232.1, 234.1, 247.1, 455/240.1
See application file for complete search history.

(56) References Cited

U.S. PATENT DOCUMENTS

| | | | | |
|---|---|---|---|---|
| 3,829,606 A | * | 8/1974 | Kawamata et al. | 348/678 |
| 4,213,097 A | * | 7/1980 | Chiu et al. | 330/51 |
| 4,234,892 A | * | 11/1980 | Mochizuki et al. | 348/678 |
| 4,329,713 A | * | 5/1982 | Harford | 348/678 |
| 4,667,163 A | * | 5/1987 | Gay | 330/129 |
| 4,667,242 A | * | 5/1987 | Hagino | 348/678 |
| 4,807,035 A | * | 2/1989 | Sayliss | 348/678 |
| 4,989,074 A | * | 1/1991 | Matsumoto | 348/572 |

(Continued)

FOREIGN PATENT DOCUMENTS

GB    2229333 A    *    9/1990

(Continued)

*Primary Examiner*—David Ometz
*Assistant Examiner*—Jean W Désir
(74) *Attorney, Agent, or Firm*—Warren L. Franz; Wade J. Brady, III; Frederick J. Telecky, Jr.

OTHER PUBLICATIONS

"Composite Analog Video Signal—NTSC for Studio Applications", ANSI/SMPTE Standard 170M-1994 (SMPTE, 1994).

(57) ABSTRACT

A video decoder (10) for receiving an input video signal and producing output signals for a digital display (12), and involving automatic gain control (AGC) functions (20, 28), is disclosed. For each of the front-end and back-end AGC functions (20, 28), the AGC gain value applied is modified according to measurements of several attributes of the video signal, such as sync height, color burst amplitude, composite signal peak amplitude, and luma signal peak amplitude. The measurements are made, and the AGC gains are modified, on a frame-by-frame basis. Preferably, the AGC is modified using the one of the signal attributes that indicates the lowest gain. The back-end AGC function (28) modifies its gain to unity if the front-end AGC function (20) selected the luma signal peak amplitude for modifying its gain. A method for adjusting the rate of change of the AGC gain is also disclosed, in which gain increases are delayed and slowed following an AGC gain decrease because of an image-dependent signal attribute.

19 Claims, 4 Drawing Sheets

U.S. PATENT DOCUMENTS

| | | | | |
|---|---|---|---|---|
| 5,050,192 | A * | 9/1991 | Nawata | 375/345 |
| 5,268,761 | A * | 12/1993 | White | 348/678 |
| 5,671,253 | A * | 9/1997 | Stewart | 375/316 |
| 5,838,390 | A * | 11/1998 | Hankinson et al. | 348/682 |
| 5,867,222 | A * | 2/1999 | Norris et al. | 348/528 |
| 6,014,180 | A * | 1/2000 | Kawano | 348/678 |
| 6,049,361 | A * | 4/2000 | Kim | 348/678 |
| 6,219,107 | B1 * | 4/2001 | Renner et al. | 348/678 |
| 6,239,848 | B1 * | 5/2001 | Mycynek et al. | 348/678 |
| 6,281,945 | B1 * | 8/2001 | Jun et al. | 348/678 |
| 6,363,127 | B1 * | 3/2002 | Heinonen et al. | 375/345 |
| 6,404,829 | B1 * | 6/2002 | Sonu | 375/345 |
| 6,459,458 | B1 * | 10/2002 | Balaban | 348/678 |
| 6,483,553 | B1 * | 11/2002 | Jung | 348/731 |
| 6,678,010 | B2 * | 1/2004 | Jun | 348/678 |
| 6,678,011 | B2 * | 1/2004 | Yanagi et al. | 348/725 |
| 6,750,906 | B1 * | 6/2004 | Itani et al. | 348/229.1 |
| 6,833,875 | B1 * | 12/2004 | Yang et al. | 348/665 |
| 6,847,407 | B2 * | 1/2005 | Min | 348/565 |
| 6,882,360 | B2 * | 4/2005 | Zeidler | 348/194 |
| 6,894,721 | B1 * | 5/2005 | Okada et al. | 348/229.1 |
| 6,968,166 | B2 * | 11/2005 | Yang | 455/234.1 |
| 6,972,800 | B2 * | 12/2005 | Sano et al. | 348/362 |
| 7,065,140 | B1 * | 6/2006 | Ritter et al. | 375/240.25 |
| 7,110,042 | B1 * | 9/2006 | Bradley | 348/534 |
| 7,206,030 | B2 * | 4/2007 | Nave | 348/678 |
| 7,215,703 | B2 * | 5/2007 | Jensen et al. | 375/224 |
| 7,218,905 | B1 * | 5/2007 | Molnar et al. | 455/240.1 |
| 2002/0005912 | A1 * | 1/2002 | Yanagi et al. | 348/725 |
| 2002/0059368 | A1 * | 5/2002 | Reynolds | 709/203 |
| 2002/0070796 | A1 * | 6/2002 | Gay-Bellile et al. | 329/304 |
| 2002/0089605 | A1 * | 7/2002 | Min | 348/565 |
| 2002/0118308 | A1 * | 8/2002 | Dujmenovic | 348/731 |
| 2004/0183953 | A1 * | 9/2004 | Nave | 348/678 |
| 2005/0280742 | A1 * | 12/2005 | Jaffe | 348/726 |
| 2006/0089813 | A1 * | 4/2006 | Mushirahad et al. | 702/39 |
| 2006/0170828 | A1 * | 8/2006 | Muschallik et al. | 348/731 |

OTHER PUBLICATIONS

"TVP5145: High-Quality, Single-Chip Digital Video Decoder for Video Applications", Product Bulletin (Texas Instruments, 2002).

"SAA7115 NTSC/PAL/SECAM 9-bit Video Decoder" (Philips Semiconductors, 2001).

* cited by examiner

AUTOMATIC GAIN CONTROL BASED ON MULTIPLE INPUT REFERENCES IN A VIDEO DECODER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of digital video systems, and is more specifically directed to video decoders.

Modern high-performance video and television displays, especially plasma and liquid-crystal (LCD) displays, are adapted to receiving digital signals corresponding to the information to be displayed. These digital inputs indicate the intensity, typically by component, to be displayed by each picture element ("pixel") of the display. For example, modern component video signals include a component value for each of the pixel attributes of luma ("Y"), chroma-blue ("Pb"), and chroma-red ("Pr"). As a result, modern high resolution displays, having over one thousand pixels in each dimension, with each pixel responsive to as much as a twenty-four bit digital signal, are able to render high fidelity images at real time data rates.

As known in the art, video inputs are communicated and stored in a wide variety of formats. Broadcast television signals are still communicated in the analog domain, and these analog signals are communicated according to multiple standards around the world. In addition, video signals from other sources are now also available for display on digital displays. These other sources include cable and satellite digital video transmissions, video cameras, and video playback devices such as DVD players and video cassette recorders. In any case, these signals are often in the form of "composite" video signals, in that the color signals are communicated in the form of "luma" and "chroma" (or color difference) signals, rather than as intensity levels for each of the primary component colors. These signals are also typically analog signals. Examples of the applicable standards for conventional video signals include the well-known NTSC (National Television Systems Committee), PAL, and SECAM composite video signal standards.

Video decoder functions are now commonly used in many high-performance digital display and television systems for receiving video signals from these various sources and converting the video signals into a digital form for display. For example, a so-called "set-top box" for receiving cable or satellite digital video transmissions and for driving a digital video display typically includes a video decoder function. Modern set-top boxes also often have auxiliary inputs for receiving video signals from other sources, from which the video decoder in the set-top box generates the digital video output signals. Other systems that include a video decoder function include video decoder cards for personal computers, personal video recorders (PVRs) for digitally recording broadcast, cable, or satellite transmissions for later viewing, digital video projectors, digital VCRs and DVD recorders, video or home theater receivers, and indeed digital television sets and computer displays that are themselves (i.e., without an external set-top box) capable of digitally displaying video output from conventional analog input signals.

Recently, the video decoder function in these systems has been implemented within a single integrated circuit. Examples of conventional video decoder integrated circuits include the TVP5145 digital video decoder available from Texas Instruments Incorporated, and the SAA7115 video decoder available from Philips Semiconductors.

In the decoding of input signals into digitally displayable output signals, conventional video decoders typically apply gain to the decoded signal, so that the digital output signals have amplitudes that fit well within the dynamic range of the display device. Conventional video decoders apply this gain by way of automatic gain control (AGC), which in its general sense amplifies a varying input voltage using a gain that depends on the input voltage itself. AGC circuits and functions thus automatically control the amplifier gain so that the output voltage remains constant or within a predetermined dynamic output range.

In conventional video decoders for converting analog video signals into digital display signals, the AGC function measures the amplitude of the analog signal at a known time within the periodic signal, and adjusts the gain of its output signal based on that amplitude. Typically, conventional video decoders sample the analog video signal at its synchronization ("sync") level, which is a portion of the analog signal in the horizontal blanking interval that is not displayable by the display but which is used to synchronize the displayable portions of the signal with the display scan lines. The sync "height", or amplitude (i.e., the difference between the sync level and a reference level, such as the "back porch" level), is used in these conventional video decoders as the control input to an AGC function, in response to which the AGC gain of the video decoder is set.

It has been observed, in connection with this invention, that the sync amplitude may not be representative of the actual amplitude of the video information to be displayed. For example, in the well-known NTSC standard, the nominal sync amplitude is −40 IRE, but this sync pulse is frequently compressed or clipped. If this clipping occurs, the clipped or compressed sync pulse received by the digital video decoder will be at a lower amplitude than its ideal amplitude. The AGC function in the conventional video decoder will, as a result, set its gain undesirably high in an attempt to compensate for the lower amplitude sync height, but this gain will be too high for the video signal itself (which was not clipped). The resulting images displayed will tend to be saturated, or too bright.

By way of further background, the SAA7115 video decoder available from Philips Semiconductors includes different AGC gain adjustment rates depending upon whether the gain is to be increased or decreased. Specifically, the SAA7115 video decoder unconditionally decreases its AGC gain rapidly and increases its AGC gain slowly. It is believed that this differential AGC gain adjustment rate approach is intended to ensure that the gain applied to bright image scenes following dark scenes of brief duration do not saturate.

BRIEF SUMMARY OF THE INVENTION

It is therefore an object of this invention to provide a video decoder that automatically controls its gain to provide accurate fidelity in the displayed images.

It is a further object of this invention to provide such a video decoder in which automatic gain control (AGC) is not deceived by the clipping of sync level or other portions of the input signal.

It is a further object of this invention to provide such a video decoder and AGC function in which correction of over-amplified portions of the signal is also performed to further improve the fidelity of the output digital video signals.

It is a further object of this invention to provide such a video decoder and AGC function in which the rate of change in the gain is controlled so that convergence to the true image sequence is optimized.

Other objects and advantages of this invention will be apparent to those of ordinary skill in the art having reference to the following specification together with its drawings.

This invention may be implemented into a video decoder integrated circuit in which automatic gain control (AGC) is performed on an incoming video signal based upon multiple attributes of that signal. According to a preferred embodiment of the invention, AGC is applied both prior to and after the separation of the input video signal into its components, where each AGC gain level is controlled using a selected one of multiple attributes of the signal.

According to another aspect of this invention, increases in the AGC gain are controlled in response to the signal attribute that caused the most recent decrease in AGC gain. More specifically, if the AGC gain is reduced due to an image-dependent attribute of the signal, subsequent increases in the AGC gain are delayed, and then more slowly increased, relative to the AGC gain increases that are permitted if the most recent AGC gain reduction were due to image-independent attributes of the signal.

DETAILED DESCRIPTION OF THE INVENTION

The present invention will be described in connection with its preferred embodiment, namely as implemented into a video decoder integrated circuit, and a system utilizing that integrated circuit. However, it is contemplated that this invention may have benefit in other applications other than the specific implementation described in this specification. Accordingly, it is to be understood that the following description is provided by way of example only, and is not intended to limit the true scope of this invention as claimed.

Figure 1:
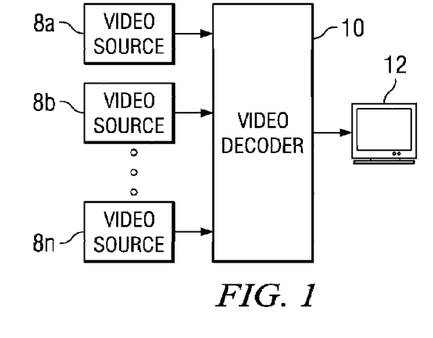
FIG. 1 is an electrical diagram, in block form, of a display system including a video decoder constructed according to the preferred embodiment of the invention.

FIG. 1 illustrates a video display system into which the preferred embodiment of the invention can be implemented. In this example, multiple video sources $8a$ through $8n$ provide video signals, according to one or multiple different standards or formats, to video decoder 10. In turn, video decoder 10 decodes the incoming video signals and presents a digital video signal to video display 12, in a format. Examples of video sources $8a$ through $8n$ include conventional video sources such as cable and satellite digital video services, video cameras, video playback devices such as DVD players and video cassette recorders, personal computers, and the like. Examples of the standards or formats of the video signals include composite signals such as those according to the NTSC, PAL, and SECAM standards, high definition TV signals, and digital video signals. Of course, the system may include any number of video sources 8, ranging from a single source to several.

Video decoder 10 as shown in the system of FIG. 1 may be implemented in various parts of the system. For example, video decoder 10 may be implemented within a set-top box, capable of receiving inputs from multiple video sources and delivering digital video signals to display 12. Alternatively, video decoder 10 may be physically implemented within one or more of video sources 8 that are capable of providing digital video signals directly to display 12; an example of this implementation is on the graphics card of a personal computer or workstation. Another example is the incorporation of video decoder 10 within a DVD recorder or playback system, or digital VCR. It is contemplated that these and other arrangements are well-known to those in the art having reference to this specification. For purposes of this invention, the physical location of video decoder 10 is not particularly important.

Figure 2:
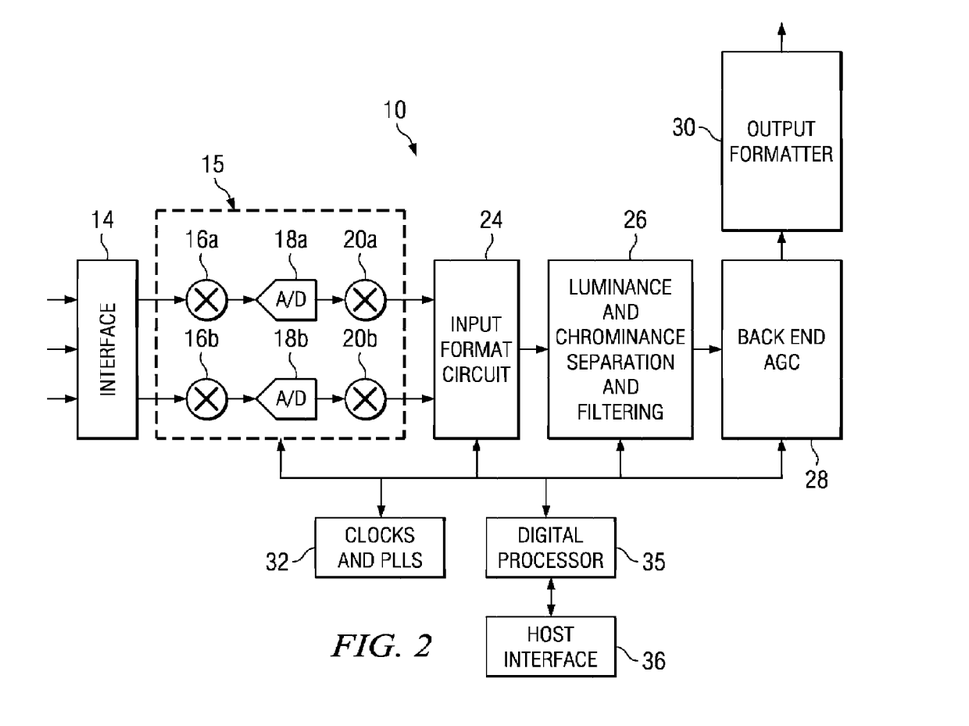
FIG. 2 is an electrical diagram, in block form, of a video decoder constructed according to the preferred embodiment of the invention.

FIG. 2 illustrates, in block form, the construction of video decoder 10 according to the preferred embodiment of the invention. Input interface 14 receives one or more input video signals from video sources $8a$ through $8n$ (FIG. 1), and buffers and level-converts those input signals in the conventional manner, according to the nature of the signals received and the requirements of downstream functions within video decoder 10. The input video signals are then applied to analog front-end 15, which performs functions including coarse gain control, analog-to-digital conversion, and also digital automatic gain control according to this preferred embodiment of the invention as will be described below.

More specifically, analog front-end 15 includes coarse gain control functions $16a$, $16b$, which apply a coarse AGC correction to the signals received by interface 14. Offset compensation (not shown) may also be applied at this point. As will be described in further detail below, coarse gain control functions 16 operate in the analog domain, yet are digitally controlled. The analog outputs of coarse gain control functions $16a$, $16b$ are then applied to analog-to-digital converters (ADCs) $18a$, $18b$, respectively, which sample the amplified analog signals and convert them into the digital domain, as known in the art. Preferably, ADCs 18 are at least of ten-bit resolution, for high-fidelity and high-definition video display functionality. The video signals, now in the digital domain in the form of sampled datastreams, are then applied to respective digital front-end AGC functions $20a$, $20b$, which apply a finer AGC correction to the digital video signals. According to the preferred embodiment of the invention, digital front-end AGC functions $20a$, $20b$ set their gains by way of feedback measurements of a selected signal attribute, as will be described in further detail below. Offset compensation (not shown) may also be performed after digital front-end AGC functions 20. Input format circuit 24 comprehends the blanking intervals and other synchronization information contained within the video signals, for the particular signal standard or format received from digital front-end AGC functions 20a, 20b, and strips the displayable information (e.g., luma and chroma) from the incoming video signals, in the conventional manner.

Separation and filtering function 26 performs the bulk of the video decoding operation, more specifically the luma and chroma separation function. In the case of conventional composite video signals, for example according to the NTSC (National Television System Committee) standard, the luma signal (Y) is a wideband signal that is representative of the overall brightness at each corresponding location of the image to be displayed, and as such is the only signal required for display of a monochrome image. The chroma signal is, according to this standard, communicated by two quadrature-phase signal components that are modulated onto a subcarrier at about 3.6 MHz, each component corresponding to a "color difference". In the NTSC standard, the in-phase component is B-Y (blue minus luma) and the quadrature-phase component is R-Y (red minus luma). Separation and filtering function 26 isolates and separates the luma and chroma signal components from the composite signal. Separation and filtering function 26 also applies the desired filtering to the separated signals, for example by way of an adaptive three-line or four-line comb filter or the like, to reduce cross-luma and cross-chroma artifacts, as known in the art.

According to the preferred embodiment of the invention, back-end AGC function 28 applies another digital automatic gain control (AGC) to the separated component signals produced by separation and filtering function 26. The manner in which back-end AGC function 28 performs this function will be described in further detail below. The modified signal from back-end AGC function 28 is forwarded to output formatter 30, which demodulates the chroma components and, by way of conventional linear combination or the like, separates the chroma signals into the appropriate color component signals (e.g., Pb, Pr). Output formatter 30 also arranges the resulting digital component values into the appropriate components of the desired format for output to display 12. Examples of typical digital video output formats applied by output formatter 30 include the 4:2:2 format at various data rates, and also the format specified by the ITU-R.BT.656 standard, with embedded syncs, at various bit rates.

Video decoder 10 includes support circuitry and functions for controlling its operation, and for providing access to external devices, for example to program the various options under which video decoder 10 is to process the video signals. Clock circuitry 32 receives or generates a system clock signal, and typically includes phase-locked loops for generating internal clock signals for operation of the various functions within video decoder 10. Digital processor 35 is preferably a programmable logic device, for example a microprocessor or digital signal processor (DSP), for performing the necessary digital logic and control operations involved in video decoder 10, including the control of front-end AGC function 20 and back-end AGC function 28. Digital processor 35 is bidirectionally coupled to host interface 36, by way of which control signals are received, and monitoring and status signals are output, by video decoder 10. For example, it is contemplated that configuration commands can be applied to video decoder 10 via host interface 36 to set the operational environment of video decoder 10, including various parameters related to the updating of AGC gain values for front-end AGC function 20 and back-end AGC function 28, as will be described in further detail below.

Other processing functions (not shown in FIG. 2) may also be included within video decoder 10. For example, as known in the art, text and other information is often encoded within the vertical blanking interval (VBI) of a television signal. Examples of this information includes closed captioning or other subtitles associated with the content being displayed. This information may be decoded by a VBI processing circuit within video decoder 10, operating in combination with input format circuit 24. Circuitry for processing copy protection information, for example according to the MACROVISION copy protection scheme, may also be included within video decoder 10, also operating in combination with input format circuit 24. These and other alternative functions and implementations are contemplated to be within the capability of those of ordinary skill in the art having reference to this specification.

Figure 3:
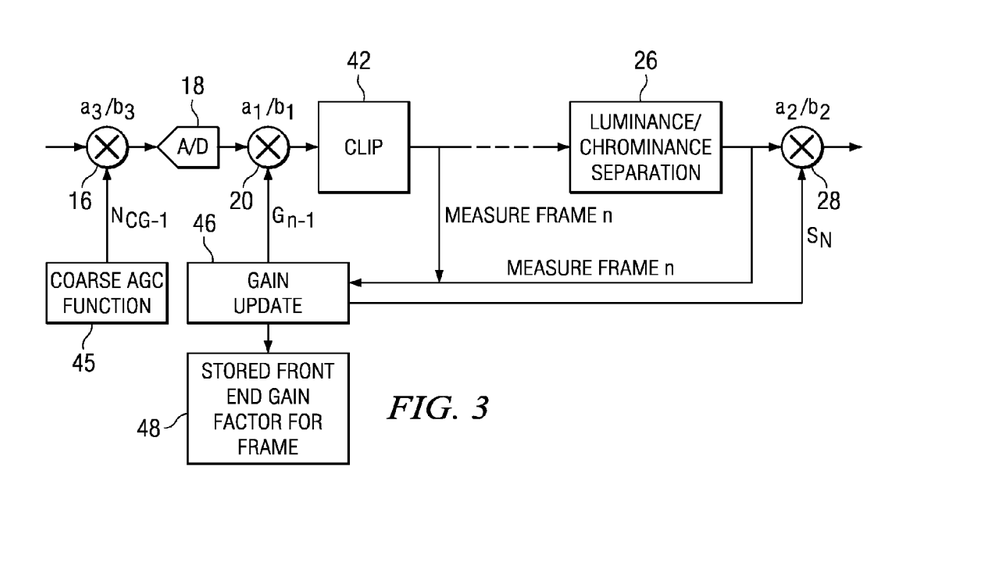
FIG. 3 is a data flow diagram illustrating the operation of the front-end AGC function in the video decoder constructed according to the preferred embodiment of the invention.

Referring now to FIG. 3, the operation of front-end AGC function 20 for a single one of the channels processed by video decoder 10, according to the preferred embodiment of the invention, will now be described in detail. As shown in FIG. 3, the input video signal (e.g., from input interface 14) is amplified by coarse AGC stage 16 in front-end AGC function 20. The gain ($gain_{16}$) applied by coarse AGC stage 16 follows a conventional linear AGC characteristic:

$$gain_{16} = a_3 + b_3 N_{CG-1} \quad (1)$$

where $N_{CG-1}$ is a digital control value (e.g., a four-bit value) for setting the coarse gain, and where $a_3$ is the y-intercept and $b_3$ is the slope of the linear AGC characteristic. Again, as mentioned above, offset compensation (not shown) may also be performed in the analog domain. ADC 18 converts the output of coarse AGC gain stage 16 to the digital domain.

Digital front-end AGC stage 20 similarly applies AGC to the digital signal. According to this embodiment of the invention, the gain value $gain_{20}$ of digital front-end AGC stage 20 similarly follows a linear AGC control characteristic:

$$gain_{20} = a1 + b_1 G_{n-1} \quad (2)$$

where $G_{n-1}$ is a digital control value (e.g., of eight bits or more, for precision) for setting the AGC gain, and where $a_1$ and $b_1$ are the y-intercept and slope, respectively, of the linear AGC control function. In one exemplary implementation of this invention, the product of the gain applied by front-end AGC stage 20 with the previously-applied coarse AGC gain may vary in a range from 0.25 to 4.00, each stage applying a gain ranging from 0.50 to 2.00. The amplified input video signal is then clipped, in the conventional manner, by clip stage 42, and is then forwarded along the data path of video decoder 10. As shown in FIG. 2, the amplified and clipped input signal is convened into the digital domain by one or both of ADCs 18, and processed according to its input format by input format function 24. Ultimately, the input signal (now in the digital domain) is then processed by separation and filtering function 26, by way of which the luma and chroma signals are separated, and eventually demodulated and converted into the digital component values as described above.

According to the preferred embodiment of the invention, front-end AGC stage 20 adjusts its current gain control value $G_{n-1}$ to provide an updated gain control value $G_n$ based on the measurements of multiple attributes in the video signal. As shown in FIG. 3, these measurements include measurements of the input signal after gain stage 20 and clip function 42, prior to luma and chroma separation. Some of these attributes may be considered as indirectly correlating to the output signal, while others directly correlate to the output. These measurements of the various attributes of the signal are applied to gain update calculator 46, by way of which the next gain control value $G_n$ is derived. In addition, certain parameters regarding the front-end AGC gain are communicated to back-end AGC function 28, as shown in FIG. 3. The particular circuit function within analog front-end 15 that makes these measurements and update calculations may be implemented by custom logic, or by programmable logic under the control of a software routine, or alternatively these measurements and calculations may be made by other circuitry in video decoder 10, for example digital processor 35 (FIG. 2) and forwarded to analog front-end 15 as a control signal. While the following description will refer to functions within analog front-end 15 as performing gain update and storage functions, those skilled in the art having reference to this specification will realize that such functions may be implemented in any one of a number of ways, without departing from this invention.

The manner in which the invention may be applied to video signals may vary with the types of signals being processed. For example, the processing of component video signals (Y, Pb, Pr) may be carried out by calculating the best gain values for the luma component (Y), and then simply applying the same gain values to the chroma components (Pb, Pr). For S-video and composite signals, the most precise AGC method would separately process gain values for the luma and chroma peaks, in effect performing the AGC control in parallel for these signals However, it has been found that an effective approach for these signals is to calculate the best gain values for the luma signal according to the preferred embodiment of the invention as described below, and then calculate the AGC gain values for the chroma signals based only on color burst amplitude. It is contemplated that these, and other, alternative implementations of the preferred embodiment of the invention will be apparent to those skilled in the art having reference to this specification, and that these alternative implementations are within the scope of this invention as claimed.

Figure 4:
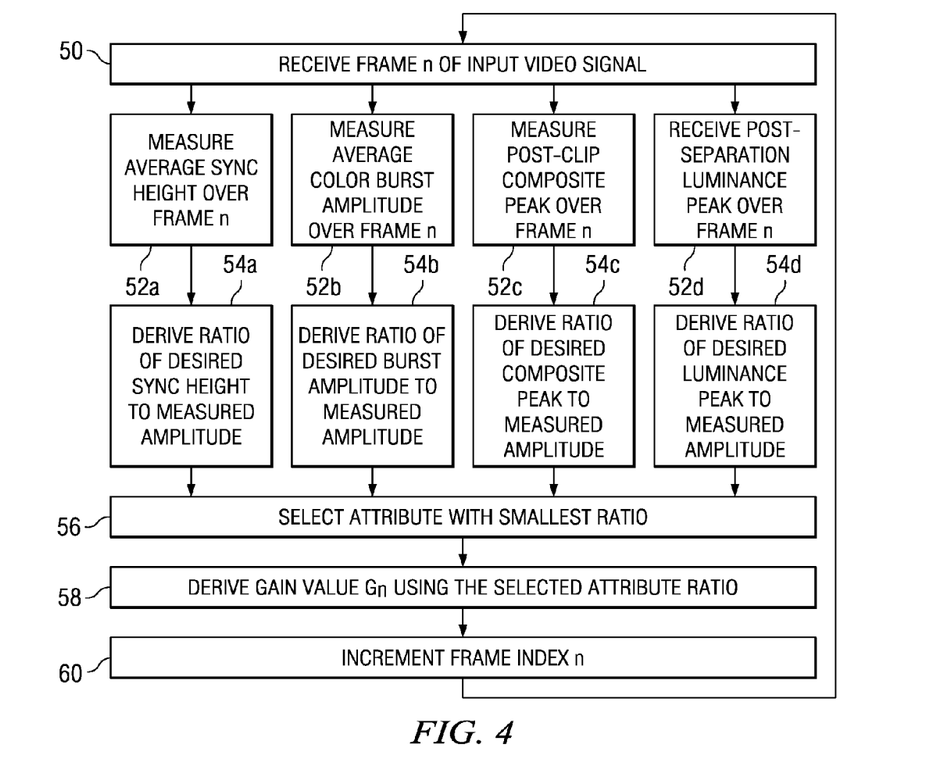
FIG. 4 is a flow chart illustrating the operation of the updating of the front-end AGC gain value, according to the preferred embodiment of the invention.

FIG. 4 is a flow diagram illustrating the operation of analog front-end 15 in updating the current gain control value $G_{n-1}$ to its next iterative value $G_n$, according to the preferred embodiment of the invention. Coarse AGC stage 16 may also similarly adjust its output (more coarsely, of course) in the conventional manner; however, this preferred embodiment of the invention is primarily based on the fine adjustment and control of AGC gain, and as such will generally assume that the coarse gain value N is essentially constant. In this exemplary implementation, analog front-end function 15 continually updates its gain control value $G_n$ on a frame-by-frame basis, based on the content of the video input signal for the most recently received and processed frame n. The applied gain control value $G_0$ for the first frame may be an arbitrary value, perhaps in the mid-range of the available gains; the gain control value $G_n$ for later frames will be derived by an iterative adjustment from the previous frame. The flow diagram of FIG. 4, in combination with FIG. 3, illustrates the operation of this gain value updating for an exemplary iteration of this operation.

It is contemplated that the updating of AGC gain according to this embodiment of the invention may be effected within the vertical blanking interval after the receipt and processing of each frame, so that the new gain value may be applied to the next incoming video frame. Alternatively, it is contemplated that the updating of the gain value may be performed on either a more frequent or a less frequent interval than after each frame. For example, if sufficient processing capacity is available, the gain updating may be performed on a field-by-field basis, or even after every one or several scan lines, to provide even higher fidelity AGC; conversely, if lesser fidelity can be tolerated, cost can be saved by updating the AGC gain after every two (or more) frames. It is contemplated that those skilled in the art having reference to this specification will be readily able to select the appropriate updating interval. However, it is also contemplated that updating at the frame rate will be optimum in most modern applications of this invention.

Referring to FIG. 4, a frame n of video input signals is received and measured in process 50. Referring back to FIG. 3, this frame n has already been amplified by front-end AGC stage 20 using the current gain value $G_{n-1}$, and has been clipped as necessary by clip function 42 according to the particular clipping levels in place. Various attributes of the amplified and clipped video input signals, over frame n, are then measured from this received frame, by gain update function 46, in combination with the necessary associated circuitry within video decoder 10, in processes 52. In addition, as shown in FIG. 3, one or more attributes of the video input signal for frame n are measured in process 52d at a point, in this example, after luma and chroma separation by separation and filtering function 26 (FIG. 2). According to this embodiment of the invention, the multiple attributes of the input video signal that are measured in processes 52 include attributes of the signal that are factors in the brightness of the image and in the quality of the video signal itself. Some of these factors are independent of the image to be displayed, and are contained within the horizontal blanking interval between successive scan lines of video signal. Some of the factors indirectly correlate to the output signal level, while others directly correlate to the output.

Figure 5:
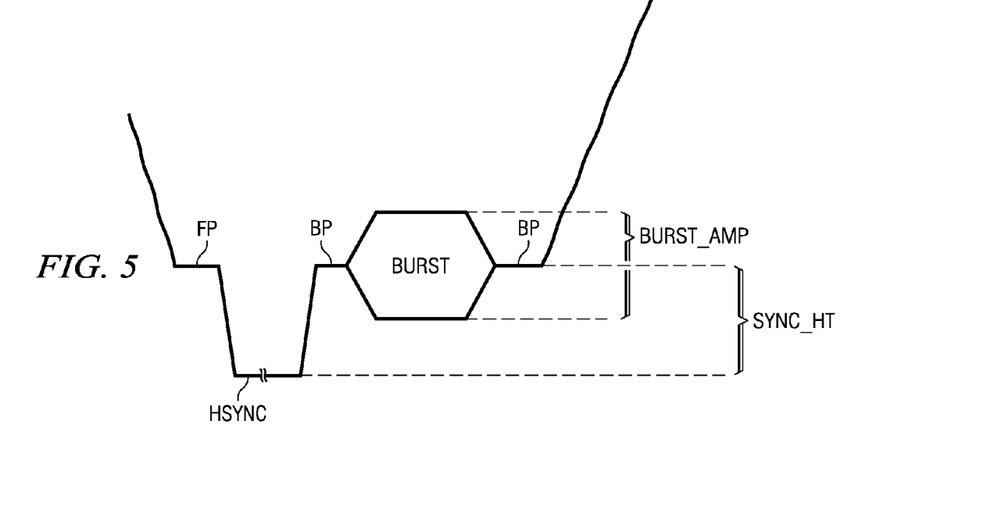
FIG. 5 is a timing diagram illustrating an exemplary input video waveform used by the video decoder according to the preferred embodiment of the invention.

FIG. 5 illustrates an exemplary waveform of the horizontal blanking interval in an NTSC television signal. As known in the art, the horizontal blanking interval is a portion of the video signal waveform following the image signal for one scan line, and contains signal portions that are used to synchronize the receiving system from a timing and amplitude standpoint. In this NTSC horizontal blanking interval shown in FIG. 5, horizontal sync pulse HSYNC is a low level portion of the horizontal blanking waveform following the image data for a scan line, and has a desired level of −40 IRE units relative to the so-called "blanking level" of 0 IRE units in the NTSC standard. Horizontal sync pulse HSYNC is preceded by a brief "front porch" pulse FP which is nominally at the blanking level of 0 IRE units. Color burst BURST is contained within the so-called "back porch" BP, and consists of an amplitude modulated continuous sine wave at the chroma signal frequency of 3.579545 MHz, and nominally has an amplitude of ±20 IRE units. Back porch BP refers to the portion of the horizontal blanking waveform from the rising edge of the horizontal sync pulse HSYNC to the beginning of active video, and includes the color burst BURST.

In process 52a, the attribute measured is the "sync height" of the video signal. In this example, the sync height attribute refers to the amplitude of the horizontal sync tip level relative to the so-called "back-porch" level in the horizontal blanking interval. Accordingly, the "sync height" measured in process 52a is the difference between the level of the horizontal sync pulse HSYNC and the back porch level BP. Process 52b measures another image-independent attribute in the horizontal, blanking interval, namely the amplitude of color burst BURST. Preferably, the attributes of sync height measured by process 52a and of color burst amplitude measured by process 52b are measured for each horizontal blanking interval and averaged over the frame, to account for variations within the frame.

Process 52c measures an attribute of the video signal that depends upon the image to be displayed, namely the peak amplitude of the composite signal. According to this embodiment of the invention, this peak amplitude is the highest composite signal amplitude for frame n after clipping by clip function 42. This peak amplitude is preferably measured relative to the level of back porch BP in the horizontal blanking interval (i.e., 0 IRE units), and is preferably the peak level encountered anywhere in the frame. This peak composite amplitude measured in process 52c is also measured prior to separation of the luma and chroma signals.

The attributes of sync height, burst amplitude, and composite peak amplitude, each indirectly correlate to the eventual output from video decoder 10. Process 52d measures an attribute of the video signal following luma and chroma separation, namely the peak amplitude of the luma signal (i.e., without the modulated chroma, or color difference signals), within the current frame n. This peak luma amplitude directly correlates to the output video signal from video decoder 10, as the luma is the overall brightness of a picture element, without regard to its color or hue. As mentioned above, it is contemplated that the update process of FIG. 4 can be performed in real time, before the vertical blanking interval, which permits the measurement of process 52d after separation.

Those skilled in the art having reference to this specification will appreciate that other signal attributes may additionally be measured, or measured instead of those described above, in connection with the AGC function according to this invention. It is believed, however, that the measurements of processes 52a through 52d will provide a relatively accurate indication of the amplitudes of the video signal for a given frame, for purposes of performing automatic gain control. In addition, measurement processes 52 (and also the corresponding comparison processes 54 to be described below) are shown in FIG. 4 as being performed in parallel with one another. This depiction is intended to express that the order in which these measurements and comparisons are made is not important; indeed, these measurements may be made in parallel with one another as shown, sequentially with one another in any order, or in some combination. It is contemplated that those skilled in the art having reference to this specification will be capable of making the appropriate measurements of the video signal for the AGC function in an optimal manner, for example as valid information becomes available, for each given implementation of this invention.

In process 54a, gain update function 46 compares the sync height measured in process 52a against a desired level. According to this embodiment of the invention, the result of the comparison of process 54a is a ratio of a nominal, or target, sync height (e.g., 40 IRE units) to the measured (averaged) sync height, as such a ratio is useful in the updating of the AGC gain level as will be described below. Similarly, in process 54b, gain update function 46 compares the burst amplitude measured in process 52a against a target amplitude, preferably producing a ratio of the target amplitude to the measured (averaged) burst amplitude. However, in the event that video decoder 10 cannot lock to a valid color burst, comparison process 54b preferably returns a null value so that the burst amplitude attribute will not be used to set the AGC gain value. Process 54b may not be performed for SECAM input video signals, but is preferably performed for NTSC and PAL input video signals.

Gain update function 46 compares the peak composite signal amplitude measured in process 52c against a target level to produce a corresponding ratio, in process 54c. Preferably, process 54c is also gated by video decoder 10 locking to a valid color burst; if it is not, comparison process 54c also returns a null value so that the peak composite signal amplitude attribute will not be used to set the AGC gain value.

In process 54d, gain update function 46 compares the peak luma amplitude for frame n as measured in process 52d against its target amplitude, producing a ratio of the two. This attribute is valid, for purposes of AGC gain setting, for both monochrome and color input signals.

According to this embodiment of the invention, it is preferred that front-end AGC stage 20 not apply a gain that causes any portion of the video waveform to be clipped. Accordingly, gain update function 46 in this preferred embodiment of the invention updates the gain level $G_{n-1}$ to value $G_n$ by selecting, in process 56, the most conservative one of the comparison ratios derived in processes 54, which will provide the lowest gain. The selected comparison ratio (i.e., the selected attribute and its measured and target values) is also stored in memory 48, in a manner accessible to back-end AGC function 28 as will be described below.

The comparison ratio selected in process 56 is then applied to a gain update equation by gain update function 54, in process 58. According to the preferred embodiment of the invention, the gain update equation is a recursive equation, by way of which the current gain value $G_{n-1}$ is modified by an error value, typically the error value multiplied by a filter (or convergence) factor, to derive the next gain value $G_n$. The filter factor is also referred to as a time constant of the recursive updating equation. The gain update equation may be considered as a "fine control" on the AGC gain. Adjustment of the gain of coarse AGC gain stage 16 may be accomplished by gain update function 46, for example by incrementing the coarse gain if the fine gain value ($G_n$) overflows, and decrementing the coarse gain is incremented if the fine gain value underflows. As mentioned above, the coarse AGC gain applied by stage 16 is an analog AGC gain, controlled in the conventional manner, while the fine control gain applied by front-end AGC function 20 is applied in the digital domain.

Many variations on AGC gain equations are known in the art. In general, according to this preferred embodiment of the invention, an updated gain value gain(n), based on the previous gain value gain(n−1), can be expressed as:

$$\text{gain}(n) = (1-\beta)\text{gain}(n-1) + \beta(\text{des\_gain}) \quad (3)$$

where the value des_gain is a desired gain that is determined from a measurement of the signal. For the case of feedback control, in which the signal is measured after the application of gain gain(n−1) that is being adjusted, value des_gain amounts to a desired multiplier of the applied gain. For example, if the measured signal is one-half the desired amplitude, then the value des_gain will correspond to doubling of the applied gain. Conversely, in the feed-forward context (as will be described below), where the signal is measured prior to the application of gain gain(n−1) to be adjusted, the value des_gain amounts to an absolute measure; for example, if the measured signal is one-half the desired amplitude, the value des_gain will correspond to an absolute gain of two.

In the case of front-end AGC gain stage 20, gain value $\text{gain}_{20}$ is adjusted by feedback control, based on measurement of the signal after front-end AGC gain stage 20 (and clip function 42). As noted above, adjustment of gain value $\text{gain}_{20}$ is effected by determining an adjusted digital AGC gain control value $G_n$ which, according to equation (2), will produce an adjusted gain $\text{gain}_{20}$. According to this preferred embodiment of the invention, the adjusted digital control value $G_n$ is a linear function of the amplitude reference on which the gain is based is:

$$G_n = -\frac{a_1}{b_1} + (1-\beta)\left(\frac{a_1}{b_1} + G_{n-1}\right) + \beta\left(\frac{a_1}{b_1} + G_{n-1}\right)\left(\frac{\Delta N_t}{\Delta N_m}\right) \quad (4)$$

where β is a filter coefficient value serving as a filter factor (ranging between 0 and 1), $\Delta N_t$ is the target, or desired, value of the selected amplitude reference (i.e., of the signal attribute selected in process 56) and $\Delta N_m$ is the measured value of the selected amplitude reference (i.e., the value measured in process 52 for the attribute selected in process 56). As mentioned above, the value $a_1$ is the y-intercept of the gain control equation (2), and the value $b_i$ is the slope of the gain control equation (2). For ease of computation, the y-intercept value $a_1$ of this gain control equation (2) may be set to zero, in which case gain update equation (3) simplifies to:

$$G_n = (1-\beta)(G_{n-1}) + \beta G_{n-1}\left(\frac{\Delta N_t}{\Delta N_m}\right) \quad (5)$$

or more simply yet:

$$G_n = G_{n-1} + \beta G_{n-1}\left(\frac{\Delta N_t}{\Delta N_m} - 1\right) \quad (6)$$

As especially evident from gain update equation (5), a larger value of filter coefficient value β (i.e., a value closer to 1) permits the target-to-attribute ratio to more strongly affect the updated digital control value $G_n$, while a smaller value of filter coefficient value β (i.e., a value closer to 0) permits the target-to-attribute ratio to more weakly affect the updated digital control value $G_n$.

The particular gain update equation used in process 58 preferably follows a linear update equation, for example as generally described in equations (4) through (6) above. Other relationships, including higher order gain update equations, may alternatively be used in process 58 if desired. The frame index value n is incremented, in preparation for the next frame of incoming video signals, and the process is repeated for this next frame beginning again with process 50.

As discussed above relative to FIG. 2, back-end AGC function 28 amplifies the separated signals to apply another gain value, in an automatic gain control (AGC) manner. According to this preferred embodiment of the invention, back-end AGC function 28 applies its gain $gain_{28}$ according to a linear gain control equation:

$$gain_{28} = a_2 + b_2 S_{n-1} \quad (7)$$

in which $a_2$ and $b_2$ are the y-intercept and slope, respectively, and in which $S_{n-1}$ is the current digital control value. Also according to this embodiment of the invention, the back-end AGC gain is updated according to a selected one of multiple signal attributes, so that the correction applied by back-end AGC function 28 also avoids miscorrection of the image amplitude, particularly to avoid saturation. The gain applied by back-end AGC function 28 thus further ensures that the output of video decoder 10 is not improperly compensated.

Figure 6:
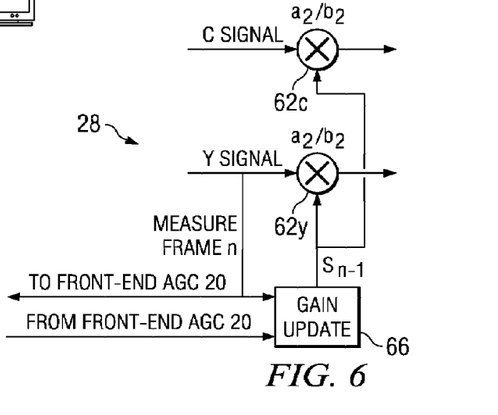
FIG. 6 is a data flow diagram illustrating the operation of the back-end AGC function in the video decoder constructed according to the preferred embodiment of the invention.

As shown in FIG. 6, back-end AGC function 28 applies a gain value $S_{n-1}$ to the luma signal Y SIGNAL and the color difference signals C SIGNAL after separation by separation and filtering function 26 (FIG. 2), using gain stages 62Y, 62C, respectively. In one exemplary implementation of this invention, this back-end AGC gain value $S_{n-1}$ may vary in a range from 1.00 to 2.00. Gain stages 62Y, 62C thus apply AGC gain amplification to the separated luma and color difference signals, to further correct and compensate for artifacts in the video decoding process and further improve the fidelity of the displayed image.

Back-end AGC function 28 also includes gain update function 66, which receives the results of the measurements carried out in processes 52 in connection with front-end AGC function 20, described above. These measurements include the peak luma amplitude in signal Y SIGNAL, taken prior to gain stage 62Y as shown in FIG. 6. Gain update function 66 calculates an updated gain control value $S_n$ based upon these measurements, following the general approach described above relative to equation (3). As will become apparent from the following description, the updating of the control value $S_n$ is performed in a feed-forward manner. The process for updating back-end AGC gain control value $S_n$ according to the preferred embodiment of the invention will now be described in detail in connection with FIG. 7.

As in the updating of the front-end AGC gain control value $G_n$ described above, multiple attributes of the video signal are also used to update the back-end AGC gain control value $S_n$. In process 72a, gain update function 66 retrieves the comparison ratio for the attribute selected in process 56 from store 48 (FIG. 3), including both an identification of which attribute the comparison ratio is associated with, and also the value of the selected comparison ratio itself. In process 74b, gain update function 66 retrieves the color burst amplitude comparison ratio derived in process 54b for frame n. In process 74c, gain update function 66 retrieves the comparison ratio of the luma peak amplitude for frame n as derived in process 54d, and in process 74d, gain update function 66 retrieves the comparison ratio for the sync height amplitude as derived in process 54a for frame n. According to the preferred embodiment of the invention, the comparison ratio for the measured composite peak amplitude (prior to signal separation) is not used for updating the back-end AGC gain.

Figure 7:
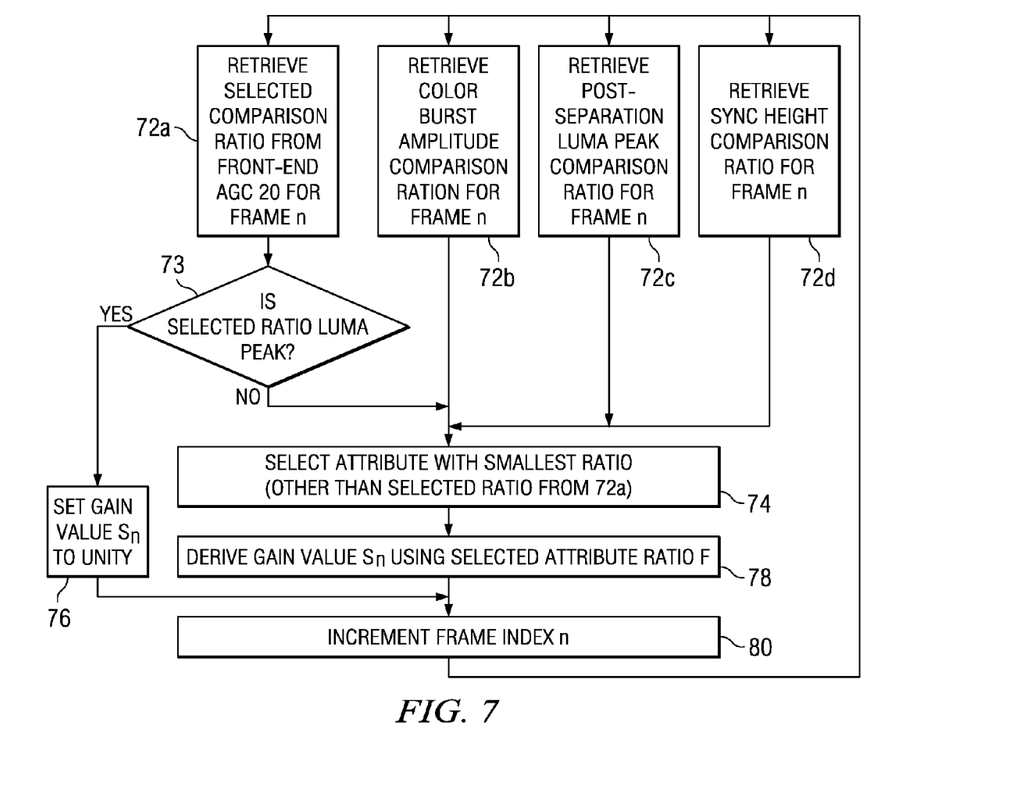
FIG. 7 is a flow chart illustrating the operation of the updating of the back-end AGC gain value, according to the preferred embodiment of the invention.

The comparison ratio used in the front-end AGC gain update calculation for frame n is interrogated in decision 73. If the front-end AGC gain calculation used the luma peak to update its gain (decision 73 is YES), the back-end AGC gain update calculation sets the updated back-end AGC gain control value $S_n$ to a default value of unity, in process 76. In other words, if the front-end AGC gain compensated for the separated luma signal already, the back-end AGC gain will not further compensate the output signal. If the luma peak was not the attribute used in the front-end AGC gain update (decision 73 is NO), control passes to attribute selection process 74.

In process 74, gain update function 66 selects the signal attribute that has the smallest comparison ratio (target to measured). As before, so that back-end AGC function 28 does not saturate the signal, the back-end AGC gain value is adjusted according to the attribute requiring the least amount of gain. Selection process 74 excludes, from its selection, the attribute that was used in the front-end AGC gain update process, as determined from process 72a. In process 78, the current back-end AGC gain value $S_{n-1}$ is modified according to a gain update equation, as will now be described in detail.

In its most general sense, the back-end AGC gain update equation involves parameters in addition to those involved in the front-end AGC gain equation. This is because the back-end AGC gain update must account for updates to the coarse AGC gain stage 16 (if any) and updates to the front-end AGC gain stage 20. In other words, the next back-end AGC gain value $gain_{28}(n)$ will be applied to a frame of video signals to which updated gain values $\text{gain}_{14}(n)$ and $\text{gain}_{20}(n)$ will also have been applied. Accordingly, the back-end AGC gain update equation will depend upon the current and updated front-end AGC gain control values $G_{n-1}$, $G_n$, respectively, and also current and updated values of the coarse analog gain control values $N_{CG-1}$, $N_{CG}$, respectively. An generalized expression of the back-end AGC gain update equation according to the preferred embodiment of the invention is:

$$S_n = -\frac{a_2}{b_2} + (1-\beta)\left(\frac{a_2}{b_2} + S_{n-1}\right) + \tag{8}$$

$$\beta\left(\frac{1}{b_2}\right)\left(\frac{\Delta N_t}{\Delta N_m}\right)\left(\frac{\frac{a_3}{b_3} + N_{CG-1}}{\frac{a_3}{b_3} + N_{CG}}\right)\left(\frac{\frac{a_1}{b_1} + G_{n-1}}{\frac{a_1}{b_1} + G_n}\right)$$

The values $\Delta N_t$ and $\Delta N_m$ are the target and measured values, respectively, of the amplitude reference (i.e., signal attribute) selected in process 74. As before, the value $\beta$ is a filter coefficient that controls the rate at which the back-end gain control value changes from iteration to iteration. In a more typical case, the y-intercept values $a_1$ and $a_2$ are zero, and equation (4) simplifies to:

$$S_n = S_{n-1} + \beta\left[\left(\frac{1}{b_2}\right)\left(\frac{\Delta N_t}{\Delta N_m}\right)\left(\frac{G_n}{G_{n-1}}\right)\left(\frac{\frac{a_3}{b_3} + N_{CG-1}}{\frac{a_3}{b_3} + N_{CG}}\right) - S_{n-1}\right] \tag{9}$$

Back-end gain update function 66 thus performs, in process 78, the required calculations to generate updated back-end AGC gain value $S_n$, using the appropriate one of equations (8) or (9), or a variation thereof depending upon the particular gain equations to be used. This gain value $S_n$ is then forwarded to gain stages 62Y, 62C for use in connection with the next frame to be processed, which will be referred to by the frame index n that is incremented in process 80. The back-end gain update process is then repeated, from processes 72, upon receipt and measurement of that next frame.

According to the preferred embodiment of the invention, additional performance improvement may be made available by an optional feature in which the rate of change of the front-end and back-end AGC gain control values, and thus the AGC gains themselves, are controlled to more closely correspond to image-dependent factors in the video signal. In the operation of video decoder 10 described above, the image-dependent signal attributes of the composite peak amplitude and the luma peak amplitude control the AGC gain only when both the sync height and color burst amplitudes are below their target levels. In this case, peak values in a bright image scene will drive the AGC gain down, and the sync height or burst amplitude attributes will drive the AGC gain back up during dark image scenes. However, if another bright scene appears after the AGC gain has been driven high by the non-image-dependent attributes, the output signal will saturate until the image-dependent attributes again drive the AGC gain down. This effect causes the display of bright image scenes after dark scenes to be unduly brightened by the AGC gain values, resulting in poor fidelity output.

According to the preferred embodiment of the invention, therefore, the filter coefficient values $\beta$ for the adjustment of both the front-end and back-end AGC gain update equations are controlled to delay and slow AGC gain increases, following a decrease in the AGC gain caused by image dependent attributes. The filter coefficient values $\beta$ for the front-end and back-end AGC gain update equations may be the same, or may differ, depending upon the particular implementation. In any case, the general operation of gain update functions 46, 66 to control the rate and delay of gain increases and decreases is similar to one another, and will now be described generally with reference to FIG. 8. This process preferably operates in conjunction with the gain update processes 58, 78 described above, and may be performed by circuitry implemented within AGC functions 20, 28, or alternatively elsewhere within video decoder 10, such as digital processor 35. Specifically, it is contemplated that the particular parameters of the process of FIG. 8, such the various filter coefficient values $\beta$ and frame delay values, are programmable by way of host interface 36 to digital processor 35, as shown in FIG. 2.

Figure 8:
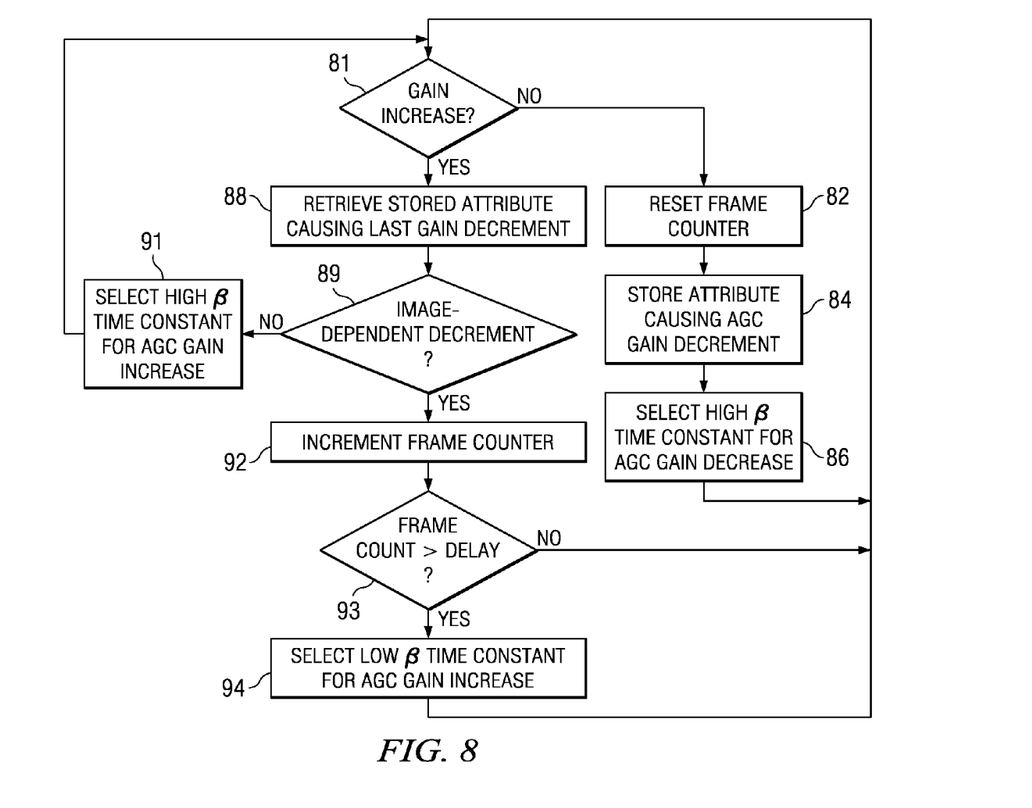
FIG. 8 is a flow chart illustrating the operation of the control of filter coefficient values for the increasing of AGC gain values, according to the preferred embodiment of the invention.

The process of FIG. 8 begins with the receipt of a frame n of video signal data. Decision 81 determines whether the AGC gain is to be increased or decreased based on the selected signal attribute and its comparison ratio. If the gain is to be decreased (decision 81 is NO), a frame counter is reset to zero in process 82, and the identity of the signal attribute causing this decrease is stored in memory by process 84. According to the preferred embodiment of this invention, all AGC gain decreases occur immediately, and at relatively fast rates. Accordingly, a high filter coefficient value $\beta$ is selected in process 86, and is used in the corresponding AGC gain update process 58, 78. An example of a high filter coefficient value $\beta$ for front-end AGC gain update process 58 is ⅛, and is unity for back-end AGC gain update process 78. Control then returns to decision 81 to await the next frame of the incoming video signal.

If the AGC gain is to be increased (decision 81 is YES), process 88 is then performed to retrieve, from memory, the identity of the signal attribute that caused the most recent AGC gain decrease. If the retrieved signal attribute causing the last decrease is an image independent attribute (e.g., sync height or color burst amplitude), decision 81 returns a NO result, indicating that the gain increase can occur immediately and rapidly. Process 92 is then executed to select a high filter coefficient value $\beta$, for example similar to the filter coefficient values for AGC gain decreases, and the corresponding AGC gain update process 58, 78 is then performed. Control then passes to decision 81 to again await the next frame of the incoming video signal.

If, on the other hand, the attribute causing the most recent AGC gain decrease is an image dependent attribute (e.g., composite signal peak amplitude, or luma signal peak amplitude), decision 89 returns a YES result. The frame counter is then incremented, in process 92, and its contents compared against a delay limit value in decision 93. The delay limit value is contemplated to be a programmable value indicating the number of frames for which indicated gain increases are to be delayed, and may vary, for example, from zero to 255, with a typical value of about 30 frames. If the number of gain increase frames counted by the frame counter has not yet reached the delay limit value (decision 93 is NO), then no AGC gain update is performed, and control returns to decision 81 to await the next frame of incoming video signals.

If the delay limit value is reached by the frame counter (decision 93 is YES), process 94 is executed to select a low filter coefficient value $\beta$ for use in the appropriate AGC gain update process 58, 78. Examples of low filter coefficient values $\beta$ range from unity to 1/128, with a typical value being on the order of 1/64. Obviously, the low high filter coefficient value $\beta$ will be lower than the high filter coefficient value $\beta$ used for gain decreases, and gain increases following nonimage-dependent gain decreases. Following selection process 94, the corresponding AGC gain update process 58, 78 is performed, and control returns to decision 81 to await the next frame of incoming video signals.

According to this preferred embodiment of the invention, therefore, the rate at which the AGC gain is increased depends upon the reason for which the AGC gain was most recently decreased. If the decrease in AGC gain was due to image-dependent signal attributes, successive AGC gain increases are delayed and slowed. This improves the fidelity of the video image sequences, by reducing the likelihood of image saturation due to bright images following a short sequence of relatively dark images in the signal. The resulting overall video result is therefore improved over that provided by conventional video decoders.

According to this preferred embodiment of the invention, therefore, the use of multiple attributes of the incoming video signal provides improved fidelity in the output video signal that is forwarded to the eventual video display. Over-correction, for example in the form of over amplifying the signal resulting in saturated "white" peaks in the displayed image, is avoided to a larger extent. In addition, the application of both front-end (pre-separation) and back-end (post-separation) AGC functions, both of which have their gains updated according to a selected one of the multiple signal attributes, provides improved overall gain control and thus improved fidelity in the displayed images. Also according to the preferred embodiment of the invention, both image-dependent and image-independent attributes are measured and may be used for gain control; these attributes also include those attributes that directly correlate to the output video signal, and those that only indirectly correlate to the output. And, as mentioned above, the rate and delay of gain increases can be controlled according to the cause of the most recent gain decrease, further preventing the likelihood of image saturation at the display. This invention thus provides a robust and high-fidelity approach to automatic gain control in the video decoder context.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A video decoder, comprising:
    input interface circuitry for receiving an input video signal;
    separation circuitry, for separating the received input video signal into signal components;
    output format circuitry for presenting an output signal to a video display;
    a first automatic gain control circuit, having an output coupled to an input of the separation circuitry, and comprising: a gain stage for amplifying a signal corresponding to the input video signal by a first gain value; and gain update circuitry, for modifying the gain value responsive to a selected one of a plurality of signal attributes of the input video signal; and
    a second automatic gain control circuit, having at least one input coupled to a corresponding output of the separation circuitry, and comprising: at least one gain stage for amplifying a signal corresponding to the output of the separation circuitry by a second gain value; and gain update circuitry, for modifying the second gain value responsive to a selected one of a plurality of signal attributes of the input video signal.

2. The video decoder of claim 1, wherein the plurality of signal attributes to which the gain update circuitry of the second automatic gain control circuit is responsive differs from the plurality of signal attributes to which the gain update circuitry of the first automatic gain control circuit is responsive.

3. The video decoder of claim 2, wherein the plurality of signal attributes, to which the gain update circuitry of the second automatic gain control circuit is responsive, comprises the selected one of the plurality of signal attributes to which the gain update circuitry of the first automatic gain control circuit modified the first gain value for a frame of the input video signal.

4. The video decoder of claim 3, wherein the selected one of the plurality of signal attributes, for each of the first and second automatic gain control circuits, corresponds to one of the plurality of signal attributes resulting in the lowest gain.

5. The video decoder of claim 4, wherein the second automatic gain control circuit excludes the selected one of the plurality of signal attributes for the first automatic gain control circuit from being its selected one of the plurality of signal attributes.

6. The video decoder of claim 4, wherein one of the plurality of signal attributes to which the gain update circuitry of the first automatic gain control circuit is responsive is a luma peak amplitude; and wherein the second automatic gain control circuit modifies the second gain value to a default value responsive to the selected one of the plurality of signal attributes for the first automatic gain control circuit being the luma peak amplitude.

7. The video decoder of claim 1, wherein the gain update circuitry modifies the first gain value based on measurements of the plurality of signal attributes for each frame of the input video signal, by either increasing or decreasing the first gain value;
    wherein the plurality of signal attributes comprises:
        at least a first signal attribute that is dependent upon the content of an image to be displayed responsive to the input video signal; and
        at least a second signal attribute that is not dependent upon the content of the image to be displayed;
    wherein the gain update circuitry modifies the first gain value responsive to a gain update equation including a filter coefficient value, higher values of the filter coefficient value corresponding to greater changes in the first gain value;
    wherein the gain update circuitry comprises a memory for storing an identity of an attribute causing a most recent decrease in the first gain value;
    wherein the gain update circuitry increases the first gain value using a first filter coefficient value responsive to the identity of the attribute causing the most recent decrease in the first gain value being the second signal attribute;
    and wherein the gain update circuitry increases the first gain value using a second filter coefficient value, lower in value than the first filter coefficient value, responsive to the identity of the attribute causing the most recent decrease in the first gain value being the first signal attribute.

8. The video decoder of claim 7, wherein the gain update circuitry delays increasing the first gain value for a selected number of frames responsive to the identity of the attribute causing the most recent decrease in the first gain value being the first signal attribute.

9. A method of controlling automatic gain control in a video decoder, comprising the steps of:
- measuring a first plurality of signal attributes of an input video signal;
- comparing each of the signal attribute measurements to a corresponding target value for the signal attribute;
- selecting one of the first plurality of signal attributes responsive to the comparing step;
- modifying a first gain value according to the selected signal attribute measurement.

10. The method of claim 9, wherein the first plurality of signal attributes comprises:
- at least one signal attribute that is dependent upon the content of an image to be displayed responsive to the input video signal; and
- at least one signal attribute that is not dependent upon the content of the image to be displayed.

11. The method of claim 10, wherein the first plurality of signal attributes comprises:
- at least one signal attribute selected from the group consisting of sync height, color burst amplitude, composite peak amplitude, and luma peak amplitude.

12. The method of claim 10, wherein the input video signal is arranged in frames;
- wherein the measuring step measures the first plurality of signal attributes for each frame;
- and wherein the comparing, selecting, and modifying steps are performed for each frame, using the signal attribute measurements for that frame.

13. The method of claim 12, wherein the modifying step modifies the first gain value according to a gain update equation including a filter coefficient value, higher values of the filter coefficient value corresponding to greater changes in the first gain value and further comprising:
- after the selecting step, determining whether the modifying step is to increase or decrease the first gain value for a frame;
- responsive to the modifying step decreasing the first gain value for a frame, storing the identity of the selected signal attribute for that frame;
- responsive to determining, for a subsequent frame, that the modifying step is to increase the gain value:
- retrieving the stored identity of the selected signal attribute;
- responsive to the retrieved selected signal attribute corresponding to a signal attribute that is dependent upon the content of an image to be displayed responsive to the input video signal, modifying the first gain value using a first filter coefficient value; and
- responsive to the retrieved selected signal attribute corresponding to a signal attribute that is not dependent upon the content of an image to be displayed responsive to the input video signal, modifying the first gain value using a second filter coefficient value, the second filter coefficient value being higher than the first filter coefficient value.

14. The method of claim 13, further comprising:
- responsive to determining, for a subsequent frame, that the modifying step is to increase the first gain value and responsive to the retrieved selected signal attribute corresponding to a signal attribute that is dependent upon the content of an image to be displayed responsive to the input video signal, delaying the step of modifying the first gain value for a selected number of frames.

15. The method of claim 9, further comprising:
- applying the first gain value to a signal corresponding to the input video signal.

16. The method of claim 15, further comprising:
- after the applying step, separating the input video signal into component signals.

17. The method of claim 16, further comprising:
- after the separating step, applying a second gain value to the component signals; and
- modifying the second gain value according to the selected signal attribute measurement.

18. The method of claim 17, further comprising:
- determining the first selected signal attribute from the first plurality of signal attributes;
- selecting one of a second plurality of signal attributes, the second plurality of signal attributes including the first selected signal attribute;
- wherein the selecting step excludes the first selected signal attribute from being selected.

19. The method of claim 17, wherein the first plurality of signal attributes comprises a luma signal peak amplitude; and further comprising:
- responsive to the first selected signal attribute being the luma signal peak amplitude, modifying the second gain value to a default value.

* * * * *